US012601983B2

(12) United States Patent
Hwang et al.

(10) Patent No.: US 12,601,983 B2
(45) Date of Patent: Apr. 14, 2026

(54) HOME POT AND APPARATUS FOR TREATING SUBSTRATE

(71) Applicant: SEMES CO., LTD., Cheonan-si (KR)

(72) Inventors: Ho Jong Hwang, Hwaseong-si (KR); Do Yeon Kim, Yongin-si (KR)

(73) Assignee: Semes Co., Ltd., Cheonan-si (KR)

( * ) Notice: Subject to any disclaimer, the term of this patent is extended or adjusted under 35 U.S.C. 154(b) by 579 days.

(21) Appl. No.: 18/145,480

(22) Filed: Dec. 22, 2022

(65) Prior Publication Data

US 2023/0205103 A1 Jun. 29, 2023

(30) Foreign Application Priority Data

Dec. 28, 2021 (KR) ........................ 10-2021-0190317

(51) Int. Cl.
B08B 3/02 (2006.01)
B05C 5/02 (2006.01)
G03F 7/00 (2006.01)
(52) U.S. Cl.
CPC ............ G03F 7/70975 (2013.01); B05C 5/02 (2013.01); B08B 3/02 (2013.01)
(58) Field of Classification Search
CPC .......... G03F 7/70975; B05C 5/02; B08B 3/02

USPC ......................................................... 134/99.1
See application file for complete search history.

(56) References Cited

U.S. PATENT DOCUMENTS

2013/0319470 A1* 12/2013 Kai ........................ B08B 3/102
134/22.12

FOREIGN PATENT DOCUMENTS

KR 10-2013-0135125 A 12/2013

* cited by examiner

*Primary Examiner* — Tinsae B Ayalew
(74) *Attorney, Agent, or Firm* — Harness, Dickey & Pierce, P.L.C.

(57) ABSTRACT

The present invention provides a home pot. The home pot comprising: a housing having a cylindrical accommodation space of which the upper part is open and in which a nozzle tip can be accommodated, and has n injection flow paths formed on a sidewall in contact with the accommodation space; and a cleaning liquid supply portion provided in the housing and configured to supply a cleaning liquid to the n injection flow paths, and the n injection flow paths are disposed to be inclined with respect to the center of the accommodation space such that a high-speed swirling flow is generated in the accommodation space.

16 Claims, 17 Drawing Sheets

FIG. 3

Cleaning
liquid

Cleaning
liquid

HOME POT AND APPARATUS FOR TREATING SUBSTRATE

CROSS-REFERENCE TO RELATED APPLICATIONS

This application claims priority to and the benefit of Korean Patent Application No. 10-2021-0190317 filed in the Korean Intellectual Property Office on Dec. 28, 2021, the entire contents of which are incorporated herein by reference.

TECHNICAL FIELD

The present invention relates to an apparatus for treating a substrate, and more particularly, to a home pot where a nozzle discharging a treatment liquid to a substrate waits and an apparatus for treating a substrate with the home pot.

BACKGROUND ART

A semiconductor process includes a process of cleaning a thin film, a foreign material, and particles on a substrate. This process is carried out by placing the substrate on a spin head such that a pattern surface thereof faces upward or downward, supplying a treatment liquid to the substrate while the spin head is rotated, and then drying the substrate.

A nozzle for supplying a substrate treatment liquid is mounted on a support member, and the support member is provided to be movable between a waiting position and a process position by a driver. The waiting position is a position where the nozzle waits before supplying the treatment liquid to the substrate, and the process position is a position where the nozzle is disposed when the substrate is treated with the treatment liquid.

In general, substrates are treated in a cup to prevent treatment liquid from being scattered, and a nozzle waits in a home pot disposed on one side of the cup. While the nozzle moves to the home pot and waits, the treatment liquid is periodically discharged from the nozzle into the home pot to prevent solidification of the treatment liquid in the nozzle. In addition, a nozzle that discharges a viscous treatment liquid (e.g., a photo resist, etc.) and a treatment liquid causing a fume to remain during evaporation of the treatment liquid is cleaned in the home pot.

The nozzle cleaning way in the home pot includes a nozzle dipping way, a direct injection way, or a swirling flow way. Since the nozzle dipping way always supplies a cleaning liquid, the use amount of the cleaning liquid increases, which may cause the nozzle to be reversely contaminated by a contaminated cleaning liquid filled in the home pot. In the direct injection way, it is likely to scatter the cleaning liquid to the outside due to the injected cleaning liquid.

FIG. 17 is a view illustrating a cleaning liquid simulation of a conventional swirling flow way.

Referring to FIG. 17, the cleaning liquid has a fast flow rate only at an inlet of a discharge portion, but the flow rate is not constant in an entire direction. Therefore, only a part of a nozzle disposed close to the inlet of the discharge portion is properly cleaned, and the other parts are not properly cleaned.

SUMMARY OF THE INVENTION

The present invention has been made in an effort to provide a home pot and an apparatus for treating a substrate, in which a cleaning liquid is uniformly provided throughout an outer surface of a nozzle tip.

The present invention has also been made in an effort to provide a home pot and an apparatus for treating a substrate which can preventing scattering of a cleaning liquid.

The present invention has also been made in an effort to provide a home pot and an apparatus for treating a substrate which can clean an entire outer surface of a nozzle tip at once.

The object of the present invention is not limited thereto, and other objects not mentioned will be clearly understood by those of ordinary skill in the art from the following description.

An exemplary embodiment of the present invention provides a home pot comprising: a housing having a cylindrical accommodation space of which the upper part is open and in which a nozzle tip can be accommodated, and provided with n injection flow paths formed on a sidewall in contact with the accommodation space; and a cleaning liquid supply portion provided in the housing and configured to supply a cleaning liquid to the n injection flow paths, and the n injection flow paths are inclined with respect to the center of the accommodation space such that a high-speed swirling flow is generated in the accommodation space.

According to the exemplary embodiment, the cleaning liquid supply portion includes: a main flow path provided outside the accommodation space; and an inlet through which the cleaning liquid flows into the main flow path, and the n injection flow paths are connected to the main flow path.

According to the exemplary embodiment, the n injection flow paths may be provided to inject cleaning liquids toward outlets of neighboring injection flow paths.

According to the exemplary embodiment, the n injection flow paths may be formed in a tangential direction with respect to an inner wall of the accommodation space.

According to the exemplary embodiment, the n injection flow paths may be provided at the same height.

According to the exemplary embodiment, the n injection flow paths may be provided at different heights.

According to the exemplary embodiment, the n injection flow paths may sequentially decrease in height from an injection flow path closest to the inlet in a swirling direction.

According to the exemplary embodiment, the n injection flow paths may be provided at equal intervals around a nozzle tip disposed in the accommodation space, and are curved when viewed from a plane.

According to the exemplary embodiment, the main channel may be provided in a ring shape.

According to the exemplary embodiment, the inlet may be formed in a tangential direction with respect to the inner wall of the main flow path.

According to the exemplary embodiment, the housing includes an outlet formed at the center of a lower end of the accommodation space.

Another exemplary embodiment of the present invention provides an apparatus for treating a substrate, the apparatus comprising: a treating unit in which the substrate is treated with liquid; a home pot provided outside the treating unit; and a nozzle unit configured to supply a treatment liquid to the substrate disposed in the treating unit and having a nozzle provided to be movable between a process position to perform a liquid treatment on the substrate in the treating unit and a waiting position (for the nozzle) to wait in the home pot, and the home pot includes: a housing having a cylindrical accommodation space of which the upper part is open and in which a nozzle tip can be accommodated, and provided with n (n is an integer of 3 or greater) injection flow paths formed on a sidewall in contact with the accommodation space; and a cleaning liquid supply portion provided in the housing and configured to supply a cleaning liquid to the n injection flow paths, and the n injection flow paths are disposed to be inclined with respect to the center of the accommodation space such that a high-speed swirling flow is generated in the accommodation space.

According to the exemplary embodiment, the cleaning liquid supply portion includes: a main flow path provided in a ring shape outside the accommodation space; and an inlet through which the cleaning liquid flows into the main flow path and which has an inlet formed in a tangential direction with respect to an inner wall of the main flow path, and the n injection flow paths are connected to the main flow path.

According to the exemplary embodiment, the n injection flow paths may be provided to inject cleaning liquids toward outlets of neighboring injection flow paths.

According to the exemplary embodiment, the n injection flow paths may be formed in a tangential direction with respect to an inner wall of the accommodation space.

According to the exemplary embodiment, the n injection flow paths may be provided at the same height.

According to the exemplary embodiment, the n injection flow paths may sequentially decrease in height from an injection flow path closest to the inlet in a swirling direction.

According to the exemplary embodiment, the n injection flow paths may be provided at equal intervals around a nozzle tip disposed in the accommodation space.

Still another exemplary embodiment of the present invention provides a home pot comprising: a housing having a cylindrical accommodation space of which the upper part is open and in which a nozzle tip can be accommodated, and provided with n (n is an integer of 3 or greater) injection flow paths formed on a sidewall in contact with the accommodation space; and a cleaning liquid supply portion provided in the housing and configured to supply a cleaning liquid to the n injection flow paths, and the cleaning liquid supply portion includes: a main flow path provided in a ring shape outside the accommodation space; and an inlet through which the cleaning liquid flows into the main flow path and which has an inlet formed in a tangential direction with respect to an inner wall of the main flow path, and the n injection flow paths are connected to the main flow path and are be inclined with respect to the center of the accommodation space such that a high-speed swirling flow is generated in the accommodation space.

According to the exemplary embodiment, the n injection flow paths may be disposed at intervals of 90 degrees with respect to the accommodation space, and a cleaning liquid discharge direction of each of the n injection flow paths may be provided to face outlets of neighboring injection flow paths.

According to the exemplary embodiment of the present invention, a cleaning liquid can be sequentially introduced through injection flow paths to maintain the same flow rate in an accommodation space, thereby uniformly cleaning an entire outer surface of the nozzle tip.

According to the exemplary embodiment of the present invention, a nozzle tip can be directly cleaned at a high flow rate in the accommodation space and indirectly cleaned with a swirling flow.

According to the exemplary embodiment of the present invention, a cleaning liquid can be prevented from being scattered.

The effect of the present invention is not limited to the foregoing effects, and those skilled in the art may clearly understand non-mentioned effects from the present specification and the accompanying drawings.

BRIEF DESCRIPTION OF THE DRAWINGS

FIG. 3 is a top plan view of the apparatus for treating a substrate of FIG. 1.

DETAILED DESCRIPTION

Figure 1:
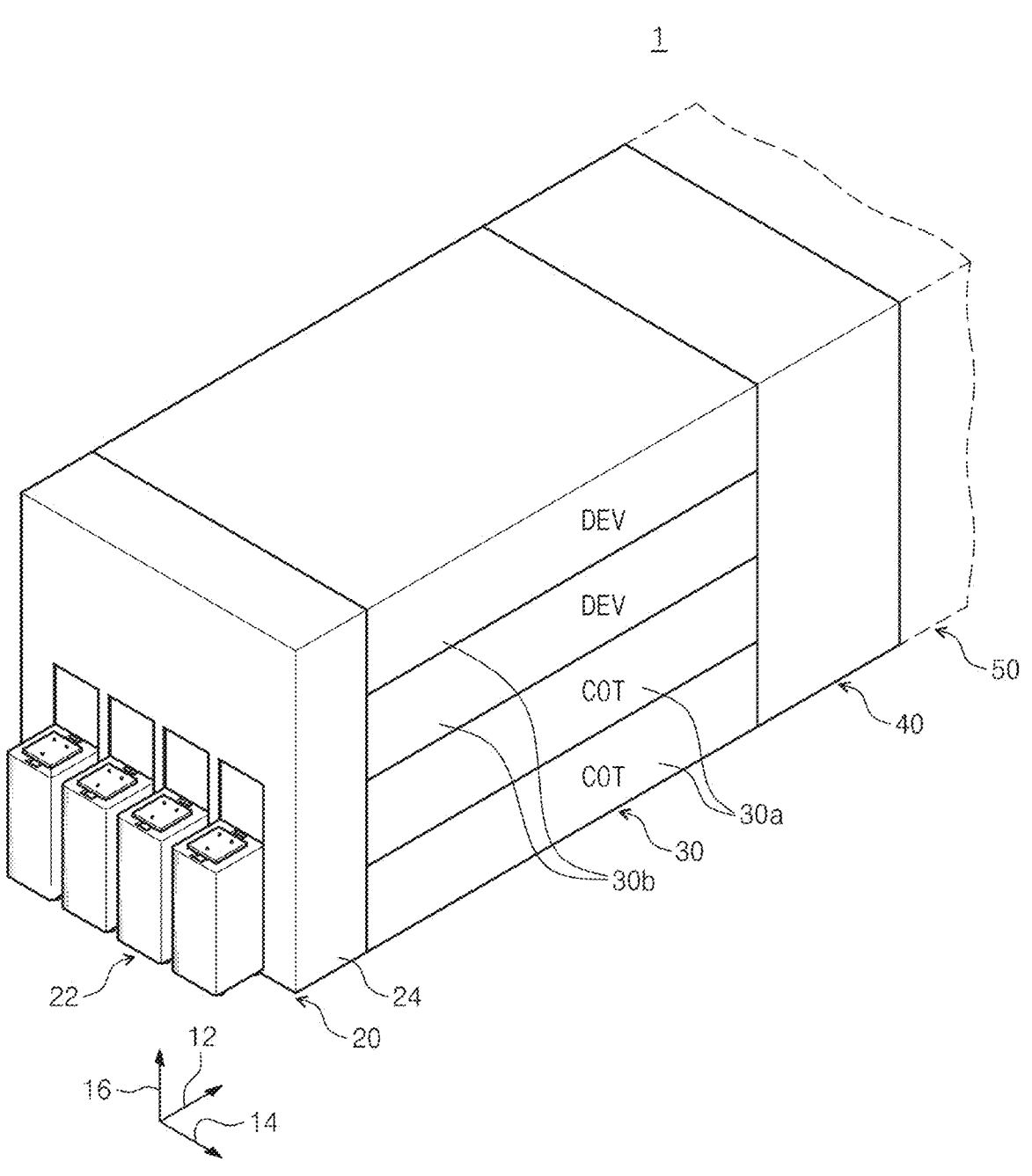
FIG. 1 is a perspective view schematically illustrating an apparatus for treating a substrate according to one embodiment of the present invention.

Hereinafter, an exemplary embodiment of the present invention will be described in detail with reference to the accompanying drawings so that those skilled in the technical field to which the present invention pertains may easily carry out the exemplary embodiment. However, the present invention may be implemented in various different ways, and is not limited to exemplary embodiments described herein. In describing the present invention, a detailed description of known functions and configurations will be omitted when it may obscure the subject matter of the present invention. Like numbers refer to like elements throughout the description of the figures.

Unless explicitly stated to the contrary, the word "comprise," "comprises" or "comprising" used throughout the specification will not be understood as the exclusion of the other elements but to imply the inclusion of the other elements. Specifically, the term "include," "comprise," "including," or "comprising," specifies a property, a region, a fixed number, a process, an element and/or a component hut does not exclude other properties, regions, fixed numbers, processes, elements and/or components.

In this specification, the singular also includes the plural unless specifically stated otherwise in the phrase. In the drawings, the shapes and dimensions of elements may be exaggerated for clarity.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The foregoing detailed description illustrates the present disclosure. Also, the foregoing is intended to illustrate and explain the preferred embodiments of the present disclosure, and the present disclosure may be used in various other combinations, modifications, and environments. That is, it is possible to make changes or modifications within the scope of the concept of the above-described disclosure, within an equivalent scope to the above-described disclosure, and/or within the skill or knowledge of the art. The above-described embodiments illustrate the best mode for carrying out the technical idea of the present disclosure, and various modifications may be made in the specific applications and uses of the present disclosure. Therefore, the detailed description of the present disclosure is not intended to limit the present disclosure to the disclosed embodiments. It is also to be understood that the appended claims are construed to cover further embodiments.

Figure 2:
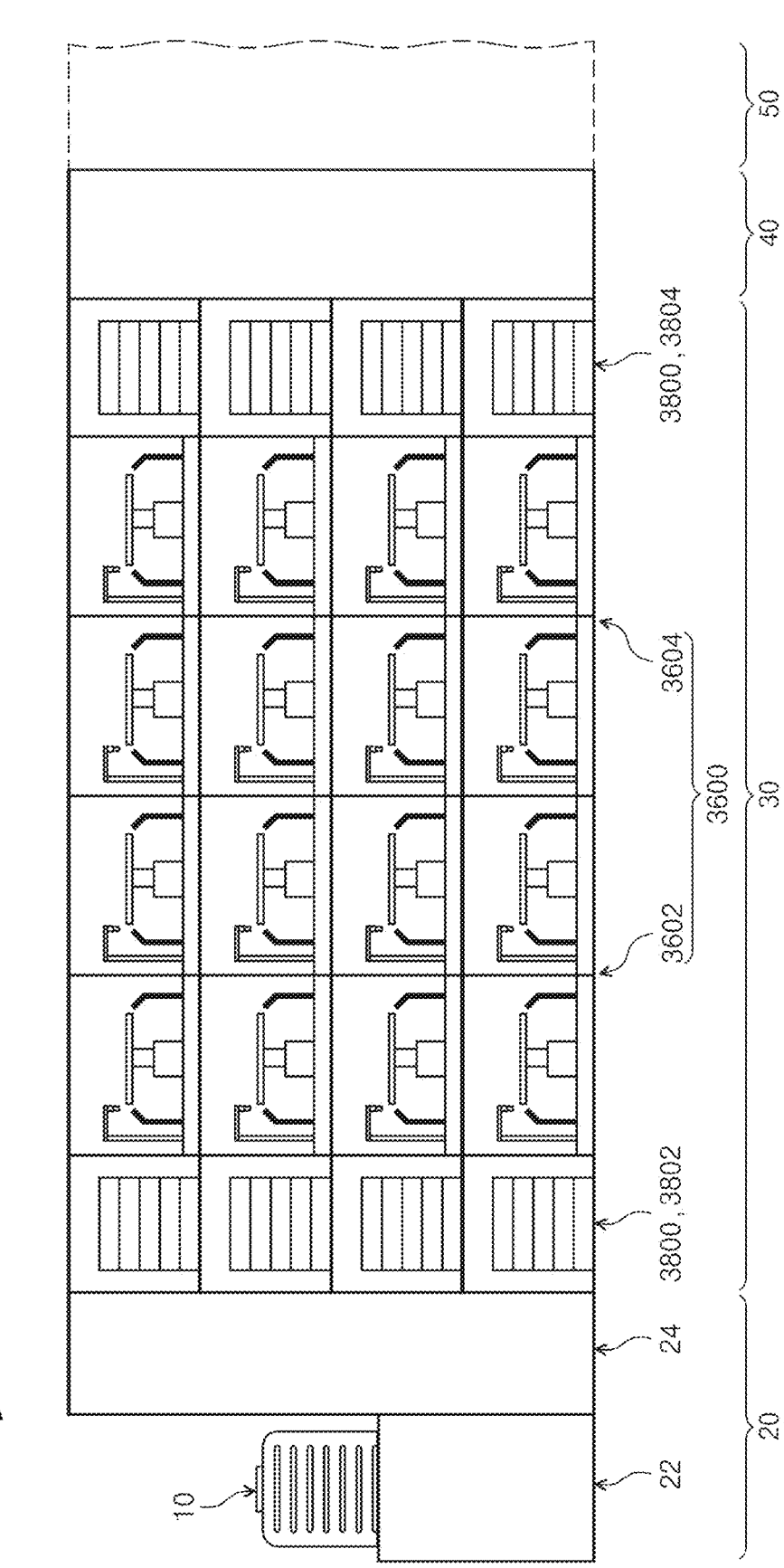
FIG. 2 is a cross-sectional view of the apparatus for treating a substrate, which shows a coating block or a developing block of FIG. 1.
Figure 3:
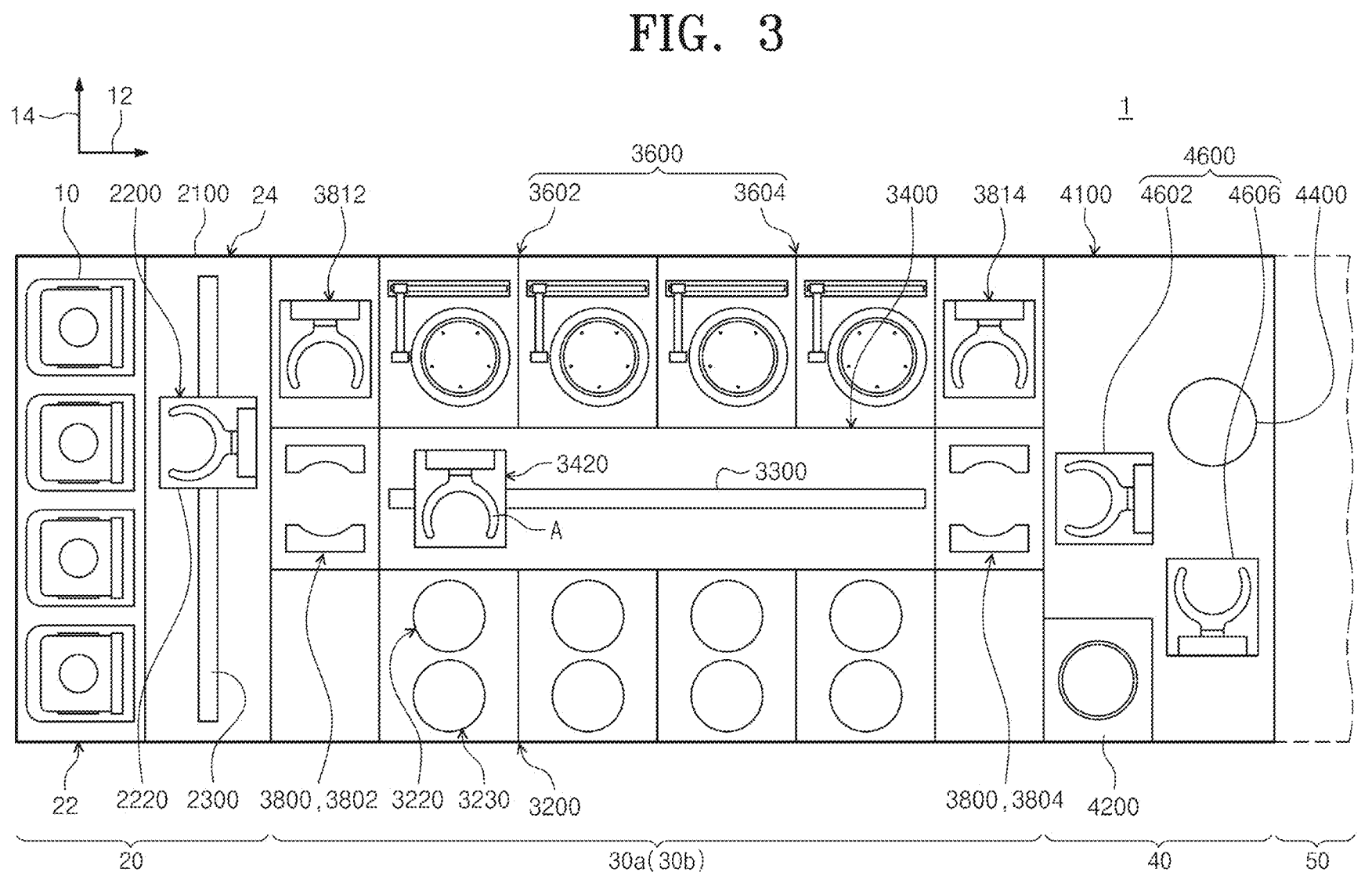

FIG. 1 is a perspective view schematically illustrating an apparatus for treating a substrate according to one embodiment of the present invention. FIG. 2 is a cross-sectional view of the apparatus for treating a substrate, which shows a coating block or a developing block of FIG. 1. FIG. 3 is a top plan view of the apparatus for treating a substrate of FIG. 1.

Referring to FIGS. 1 to 3, an apparatus 1 for treating a substrate includes an index module 20, a treating module 30, and an interface module 40. According to the exemplary embodiment, the index module 20, the treating module 30, and the interface module 40 are sequentially arranged in a line. Hereinafter, a direction in which the index module 20, the treating module 30, and the interface module 40 are arranged refers to an X-axis direction 12, a direction perpendicular to the X-axis direction 12 when viewed from the top refers to a Y-axis direction 14, and a direction perpendicular to both the X-axis direction 12 and the Y-axis direction 14 refers to a Z-axis direction 16.

The index module 20 transfers a substrate W to the treating module 30 from a container 10 in which the substrate W is accommodated, and accommodates the treated substrate W in the container 10. A longitudinal direction of the index module 20 is provided in the Y-axis direction 14. The index module 20 has a load port 22 and an index frame 24. The load port 22 is disposed on an opposite side of the treating module 30 based on the index frame 24. The container 10 in which the substrates W are accommodated is placed in the load port 22. A plurality of load ports 22 may be provided, and the plurality of load ports 22 may be disposed in the Y-axis direction 14.

A sealing container 10 such as a front open unified pod (FOUP) may be used as the container 10. The container 10 may be placed in the load port 22 by an operator or a transfer means (not illustrated), such as an overhead transfer, an overhead conveyor, or an automatic guided vehicle.

An index robot 2200 is provided inside the index frame 24. A guide rail 2300 of which the longitudinal direction is provided in the Y-axis direction 14 may be provided within the index frame 24, and the index robot 2200 may be provided to be movable on the guide rail 2300. The index robot 2200 includes a hand 2220 on which the substrate W is placed, and the hand 2220 is movable forward and backward, rotatable around the Z-axis direction 16, and movable along the Z-axis direction 16.

The treating module 30 performs a coating process and a developing process on the substrate W. The treating module 30 has a coating block 30*a* and a developing block 30*b*. The coating block 30*a* performs the coating process on the substrate W, and the developing block 30*b* performs the developing process on the substrate W. A plurality of coating blocks 30*a* are provided, and the coating blocks 30*a* are stacked on each other. A plurality of developing blocks 30*b* are provided, and the developing blocks 30*b* are stacked on each other. According to the exemplary embodiment of FIG. 3, two coating blocks 30*a* are provided, and two developing blocks 30*b* are provided. The coating blocks 30*a* may be disposed under the developing blocks 30*b*. According to the exemplary embodiment, the two coating blocks 30*a* perform the same process and may be provided in the same structure. In addition, the two developing blocks 30*b* perform the same process and may be provided in the same structure.

Referring to FIG. 3, the coating block 30*a* has a heat treatment chamber 3200, a transfer chamber 3400, a liquid treatment chamber 3600, and a buffer chamber 3800. The heat treatment chamber 3200 performs a heat treatment process on the substrate W. The heat treatment process may include a cooling process and a heating process. The liquid treatment chamber 3600 supplies a liquid to the substrate W to form a liquid film. The liquid film may be a photoresist film or an anti-reflection film. The transfer chamber 3400 transfers the substrate W between the heat treatment chamber 3200 and the liquid treatment chamber 3600 in the coating block 30*a*.

A longitudinal direction of the transfer chamber 3400 is provided parallel to the X-axis direction 12. A transfer unit 3420 is provided in the transfer chamber 3400. The transfer unit 3420 transfers the substrate between the heat treatment chamber 3200, the liquid treatment chamber 3600, and the buffer chamber 3800. For example, the transfer unit 3420 has a hand A on which the substrate W is placed, and the hand A is movable forward and backward, rotatable around the Z-axis direction 16, and movable along the Z-axis direction 16. A guide rail 3300 of which the longitudinal direction is provided parallel to the X-axis direction 12 is provided in the transfer chamber 3400, and the transfer unit 3420 may be provided to be movable on the guide rail 3300.

A plurality of liquid treatment chambers 3600 are provided. Some of the liquid treatment chambers 3600 may be stacked on each other. The liquid treatment chambers 3600 are disposed on one side of the transfer chamber 3402. The liquid treatment chambers 3600 are arranged side by side in the first direction 12. Some of the liquid treatment chambers 3600 are disposed adjacent to the index module 20. Hereinafter, these liquid treatment chambers are referred to as front liquid treating chambers 3602. The other liquid treatment chambers 3600 are disposed adjacent to the interface module 40. Hereinafter, these liquid treatment chambers are referred to as rear liquid treating chambers 3604.

The front liquid treating chamber 3602 applies a first liquid on the substrate W, and the rear liquid treating chamber 3604 applies a second liquid on the substrate W. The first liquid and the second liquid may be different types of liquids. According to the exemplary embodiment, the first liquid is an anti-reflection film, and the second liquid is a photoresist. The photoresist may be applied on the substrate W coated with the anti-reflection film. Optionally, the first liquid may be a photoresist, and the second liquid may be an antireflection film. In this case, the anti-reflection layer may be applied to the substrate W coated with the photoresist. Optionally, the first liquid and the second liquid are of the same type, and both liquids may be photoresist.

Figure 4:
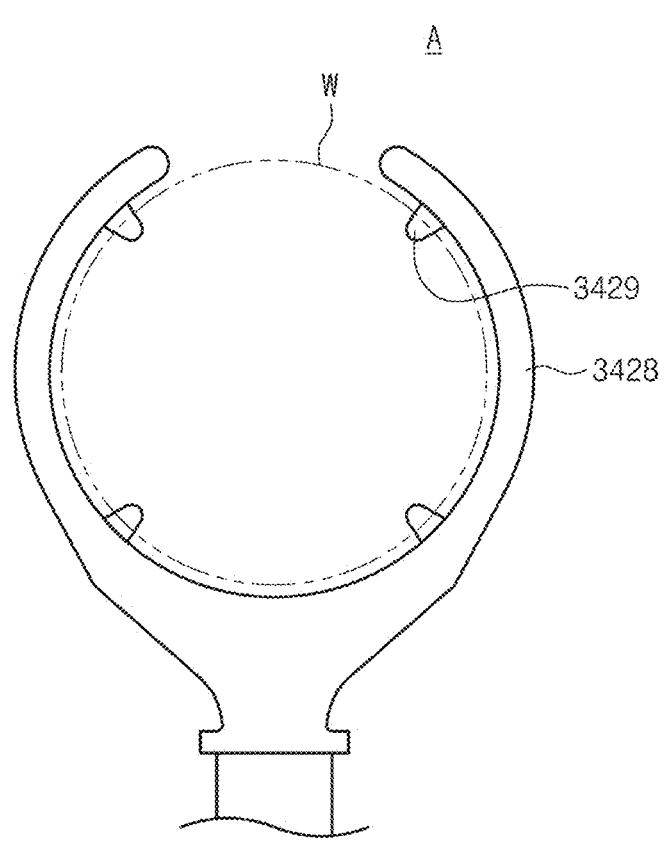
FIG. 4 is a view illustrating one embodiment of a hand of a transfer unit of FIG. 3.

FIG. 4 is a view illustrating one embodiment of a hand of a transfer unit of FIG. 3. Referring to FIG. 4, the hand A has a base 3428 and a support protrusion 3429. The base 3428 may have an annular ring shape in which a part of the circumference is cut away. The base 3428 has an inner diameter larger than the diameter of the substrate W. The support protrusion 3429 extends inward from the base 3428. A plurality of support protrusions 3429 are provided and support an edge region of the substrate W. According to the exemplary embodiment, four support protrusions 3429 may be provided at equal intervals.

Referring back to FIG. 2, a plurality of buffer chambers 3800 are provided. Some of the buffer chambers 3800 are disposed between the index module 20 and the transfer chamber 3400. Hereinafter, these buffer chambers are referred to as front buffers 3802. A plurality of front buffers 3802 are provided, and are stacked on each other in the up-down direction. The other buffer chambers 3802 and 3804 are disposed between the transfer chamber 3400 and the interface module 40. These buffer chambers are referred to as rear buffers 3804. A plurality of rear buffers 3804 are provided, and are stacked on each other in the up-down direction. Each of the front buffers 3802 and the rear buffers 3804 temporarily stores a plurality of substrates W. The substrates W stored in the front buffer 3802 are carried in or out by the index robot 2200 and the transfer unit 3420. The substrates W stored in the rear buffer 3804 are carried in or out by the transfer unit 3420 and the first robot 4602.

The developing block 30b has a heat treatment chamber 3200, a transfer chamber 3400, and a liquid treatment chamber 3600. The heat treatment chamber 3200, the transfer chamber 3400, and the liquid treatment chamber 3600 of the developing block 30b are provided in a structure and arrangement substantially similar to the structure and the arrangement in which the heat treatment chamber 3200, the transfer chamber 3400, and the liquid treatment chamber 3600 of the coating block 30a are provided, and therefore detailed descriptions will be omitted. However, in the developing block 30b, all of the liquid treatment chambers 3600 are provided as developing chambers 3600 that develop a substrate by supplying a developer in the same manner.

The interface module 40 connects the treating module 30 to an external exposing apparatus 50. The interface module 40 has an interface frame 4100, an additional process chamber 4200, an interface buffer 4400, and a transfer member 4600.

A fan filter unit for forming a downward air flow therein may be provided in an upper end of the interface frame 4100. The additional process chamber 4200, the interface buffer 4400, and the transfer member 4600 are disposed in the interface frame 4100. Before the substrate W completely treated in the coating block 40a is taken into the exposing apparatus 50, the additional process chamber 4200 may perform a predetermined additional process on the substrate W. Optionally, before the substrate W completely treated in the exposing apparatus is taken into the developing block 30b, the additional process chamber 4200 may perform a predetermined additional process on the substrate W. According to the exemplary embodiment, the additional process may be an edge exposing process of exposing the edge region of the substrate W to light, an upper surface cleaning process of cleaning the upper surface of the substrate W, or a lower surface cleaning process of cleaning the lower surface of the substrate W. A plurality of additional process chambers 4200 may be provided, and may be stacked on each other. The additional process chambers 4200 may all perform the same process. Optionally, some of the additional process chambers 4200 may perform different processes.

The interface buffer 4400 provides a space in which the substrate W transferred between the coating block 30a, the additional process chamber 4200, the exposing apparatus 50, and the developing block 30b temporarily stays during the transfer. A plurality of interface buffers 4400 may be provided, and the plurality of interface buffers 4400 may be stacked one above another.

According to the exemplary embodiment, the additional process chamber 4200 may be disposed on one side of an extension line facing in longitudinal direction of the transfer chamber 3400, and the interface buffer 4400 may be disposed on an opposite side of the extension line.

The transfer member 4600 transfers the substrate W between the coating block 30a, the additional process chamber 4200, the exposing apparatus 50, and the developing block 30b. The transfer member 4600 may be implemented with one or more robots. According to the exemplary embodiment, the transfer member 4600 has a first robot 4602 and a second robot 4606. The first robot 4602 may transfer the substrate W between the coating block 30a, the additional process chamber 4200, and the interface buffer 4400, the interface robot 4606 may transfer the substrate W between the interface buffer 4400 and the exposing apparatus 50, and the second robot 4604 may transfer the substrate W between the interface buffer 4400 and the developing block 30b.

The first robot 4602 and the second robot 4606 each include a hand on which the substrate W is placed, and the hand is moveable forward and backward, rotatable based on an axis parallel to the Z-axis direction 16, and movable along the Z-axis direction 16.

Referring back to FIGS. 2 and 3, a plurality of heat treatment chambers 3200 are provided. The heat treatment chambers 3200 are disposed to be arranged in the first direction 12. The heat treatment chambers 3200 are disposed on one side of the transfer chamber 3400.

Figure 5:
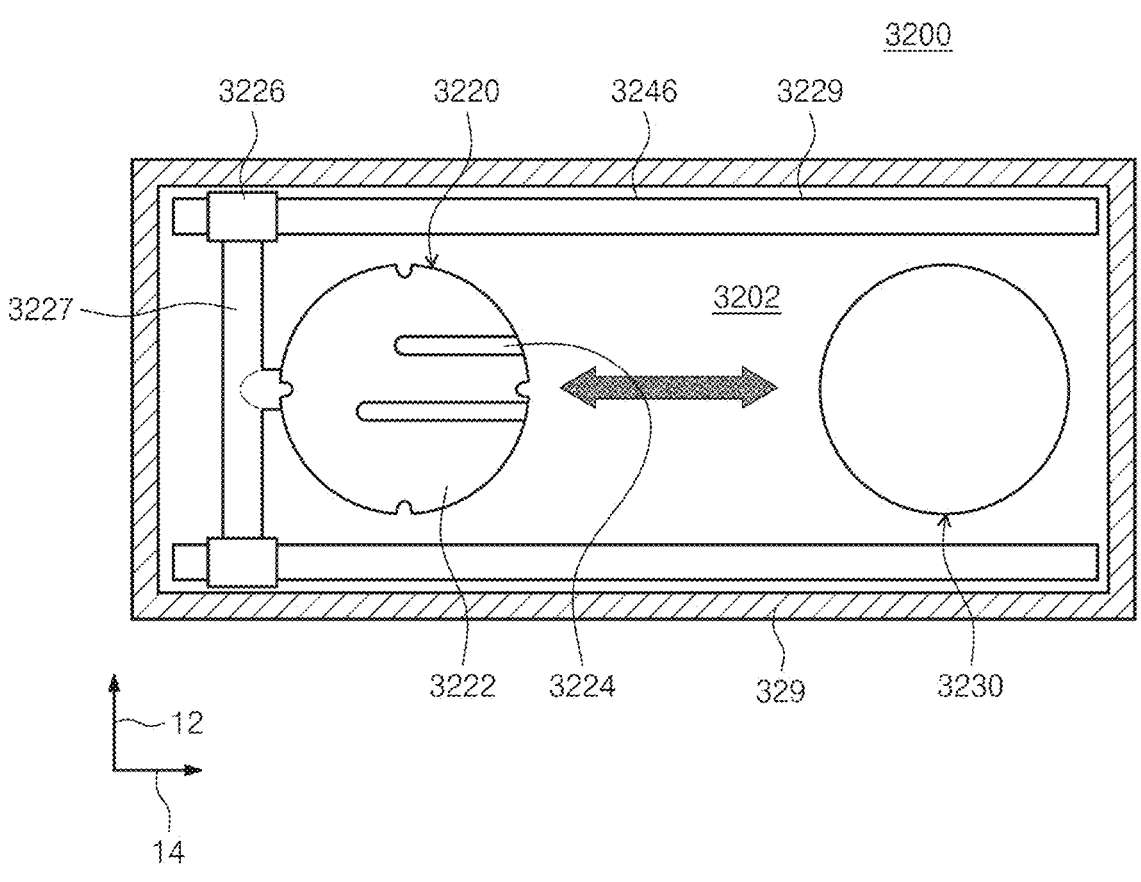
FIG. 5 is a plan cross-sectional view schematically illustrating one embodiment of the heat treatment chamber of FIG. 3.
Figure 6:
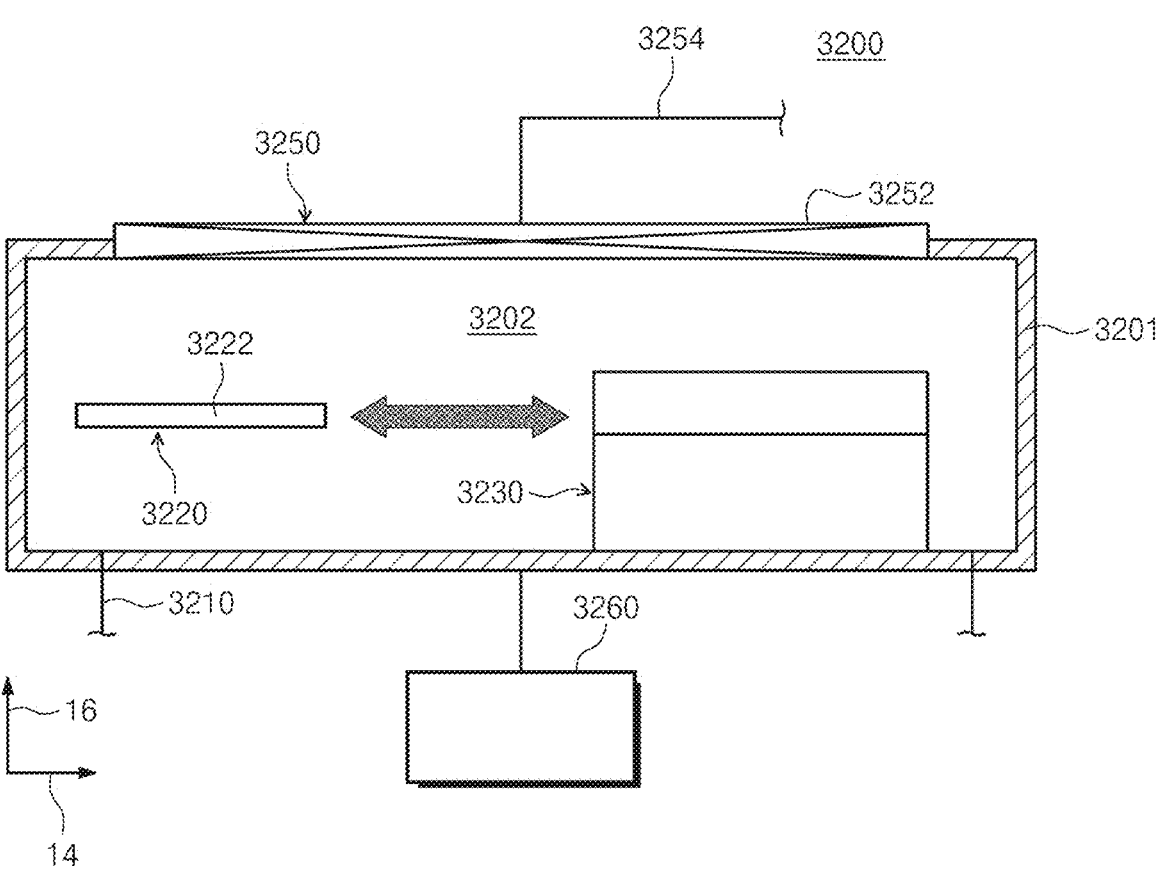
FIG. 6 is a top cross-sectional view of the heat treatment chamber of FIG. 5.

FIG. 5 is a plan cross-sectional view schematically illustrating one embodiment of the heat treatment chamber of FIG. 3. FIG. 6 is a top cross-sectional view of the heat treatment chamber of FIG. 5.

Referring to FIGS. 5 and 6, the heat treatment chamber 3200 includes a treatment container 3201 (a housing), a cooling unit 3220, and a heating unit 3230.

The treatment container 3201 has an inner space 3202. The treatment container 3201 is provided in the shape of a substantially rectangular parallelepiped. An inlet (not illustrated) through which the substrate W is carried in or out is formed on a sidewall of the treatment container 3201. In addition, a door (not illustrated) may be provided to open and close the inlet. The inlet may optionally remain open. The inlet may be formed adjacent to the cooling unit 3220.

The cooling unit 3220 and the heating unit 3230 are provided in the inner space 3202 of the treatment container 3201. The cooling unit 3220 and the heating unit 3230 are provided side by side along the Y-axis direction 14.

An exhaust line 3210 may be connected to the treatment container 3201. The exhaust line 3210 may exhaust gas supplied by the fan unit 3250 to the outside of the treatment container 3201. The exhaust line 3210 may be connected to a lower part of the treatment container 3201. However, the present invention is not limited thereto, and the exhaust line 3210 may be connected to a side part of the treatment container 3201.

The cooling unit 3220 has a cooling plate 3222. The substrate W may be seated on the cooling plate 3222. The cooling plate 322 may have a shape substantially close to a circular shape when viewed from the top. A cooling member (not illustrated) may be provided in the cooling plate 3222. According to the exemplary embodiment, the cooling member is formed inside the cooling plate 3222, and may be implemented with a flow path through which the cooling fluid flows. Accordingly, the cooling plate 322 may cool the substrate W. The cooling plate 322 may have a diameter corresponding to that of the substrate W. A notch may be formed at an edge of the cooling plate 3222. The notch may have a shape corresponding to the support protrusion 3429 formed in the hand A described above. In addition, the notch may be provided in a number corresponding to the support protrusion 3429 formed in the hand A, and may be formed in a position corresponding to the support protrusion 3429. When the upper and lower positions of the hand A and the cooling plate 3222 are changed, the substrate W is transferred between the hand A and the cooling plate 3222. A plurality of slit-shaped guide grooves 3224 are provided in the cooling plate 3222. The guide groove 3224 extends from an end of the cooling plate 322 to the inside of the cooling plate 3222. The longitudinal direction of the guide groove 3224 is provided along the Y-axis direction 14, and the guide grooves 3224 are spaced apart from each other along the X-axis direction 12. The guide groove 3224 prevents the cooling plate 3222 and a lift pin 3236 from interfering with each other when the substrate W is transferred between the cooling plate 3222 and the heating unit 3230.

The cooling plate 322 may move in the Y-axis direction 14 by a driver 3226 mounted on the guide rail 3229.

The heating unit 3230 is implemented with an apparatus 1000 for heating a substrate at a temperature higher than room temperature. The heating unit 3230 heats the substrate W in normal pressure or a decompression atmosphere below the normal pressure.

Figure 7:
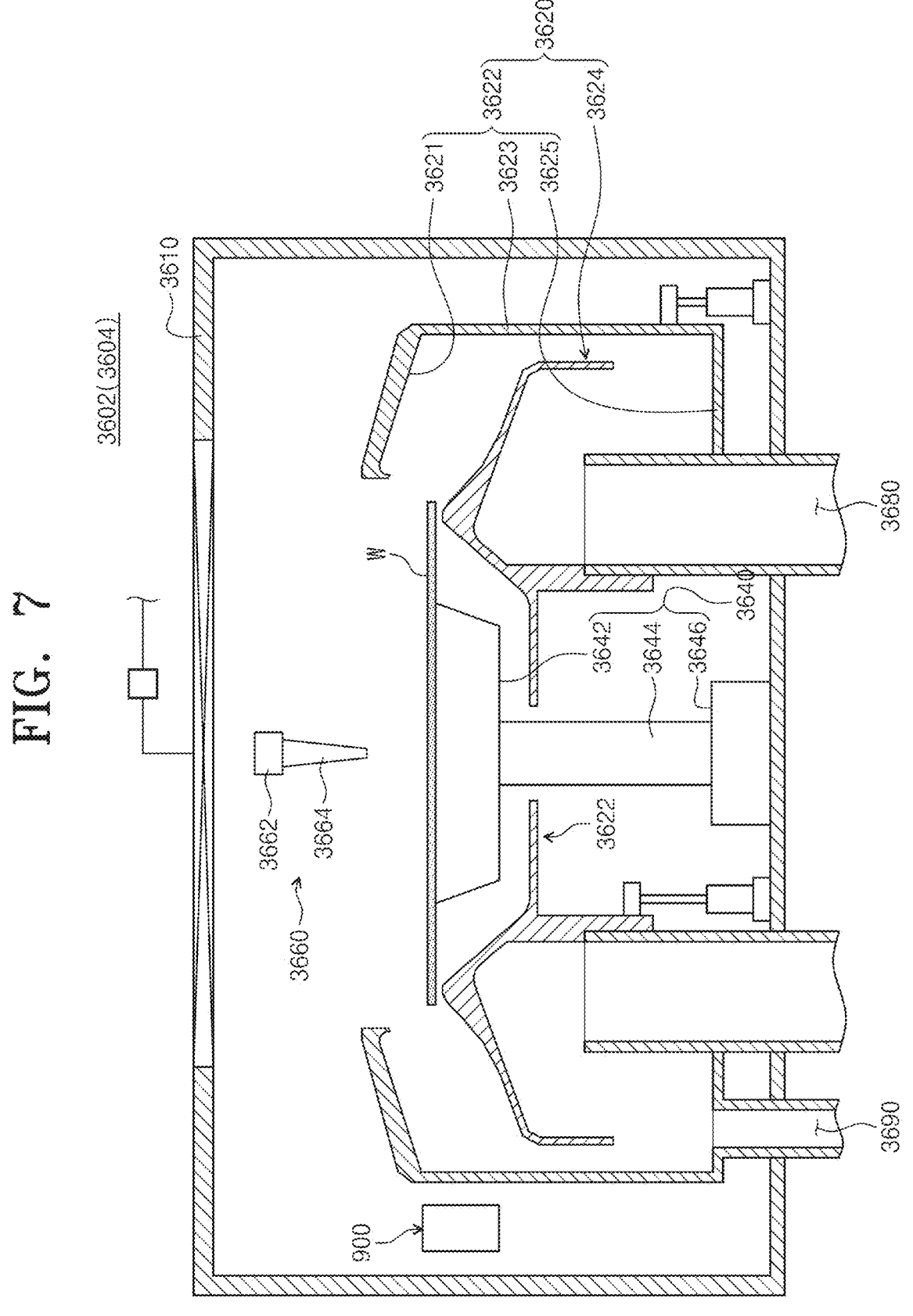
FIG. 7 is a view schematically illustrating one embodiment of a liquid treatment chamber of FIG. 3.

FIG. 7 is a view schematically illustrating one embodiment of a liquid treatment chamber of FIG. 3.

Referring to FIGS. 3 and 7, each liquid treatment chamber 3600 performs a coating process of applying a treatment liquid, such as a photosensitive liquid, on the substrate W. The liquid treatment chambers 3600 may be sequentially arranged along the first direction 12. For example, three substrate treatment units may be disposed in the housing 3610. Each of the liquid treatment chambers 3600 include a substrate support unit 3640, a treatment container 3620, and a liquid supply unit 3660.

The substrate support unit 3640 supports the substrate W in an inner space of the housing 3610. The substrate support unit 3640 rotates the substrate W. The substrate support unit 3640 includes a spin chuck 3642, a rotation shaft 364 and a driver 3646. The spin chuck 3642 is implemented with a substrate support member 3642 supporting the substrate. The spin chuck 3642 is provided to have a circular plate shape. The substrate W is in contact with the upper surface of the spin chuck 3642.

The rotation shaft 3644 and the driver 3646 are implemented with rotation driving members 3644 and 3646 for rotating the spin chuck 3642. The rotation shaft 3644 supports the spin chuck 3642 on a lower part of the spin chuck 3642. A longitudinal direction of the rotation shaft 3644 is provided to face the up-down direction. The rotation shaft 3644 is rotatable around a central axis thereof. The driver 3646 provides a driving force to rotate the rotation shaft 3644.

The treatment container 3620 is disposed in the inner space of the housing 3610. The treatment container 3620 is provided to have an open cup shape. The treatment container 3620 provides a treatment space therein. The treatment container 3620 is provided to surround the circumference of the substrate support unit 3640. That is, the substrate support unit 3640 is disposed in the treatment space. The treatment container 3620 includes an outer cup 3622 and an inner cup 3624. The outer cup 3622 is provided to surround the circumference of the substrate support unit 3640, and the inner cup 3624 is disposed inside the outer cup 3622. Each of the outer cup 3622 and the inner cup 3624 is provided in an annular ring shape. A space between the outer cup 3622 and the inner cup 3624 functions as a recovery path through which the liquid is recovered.

The nozzle unit 3660 supplies a treatment liquid to the substrate W. The nozzle unit 3660 includes an arm 3662 and a treating nozzle 3664. The treating nozzle 3664 is installed on a bottom surface of the arm 3662. Optionally, a plurality of arms 3662 may be provided, and the treating nozzles 3664 may be installed in each of the arms 3662. In addition, the arm 3662 may be coupled to a rotation shaft of which the longitudinal direction faces in the third direction and be then rotated.

The treating nozzle 3664 is moved between the process position and the waiting position by rotation of the rotation shaft. In the process position, the treating nozzle 3664 discharges the treatment liquid to the substrate supported by the substrate support unit 3640 and performs the liquid treatment on the substrate. The treating nozzle 4366 waits in the waiting position while no liquid treatment is performed on the substrate.

While the treating nozzle 3664 is disposed in the waiting position, an auto-dispense operation, a pre-dispense operation, and a nozzle cleaning operation may be performed. The auto-dispense operation is an operation of discharging the treatment liquid at predetermined time intervals when the treating nozzle 3664 waits in the waiting position for a long time. The auto-dispense operation is an operation of preventing the treatment liquid from being solidified in the nozzle unit 3660. The pre-dispense operation is an operation of discharging the treatment liquid in advance in the waiting position before discharging the treatment liquid from the treating nozzle 3664 to the substrate. When the treatment liquid is discharged to the substrate by the pre-dispense operation, the treatment liquid is smoothly dealt with.

A home pot 1000 is disposed outside the cup 3620. When viewed from the top, the waiting position of the treating nozzle 3664 overlaps the home pot 1000.

Figure 8:
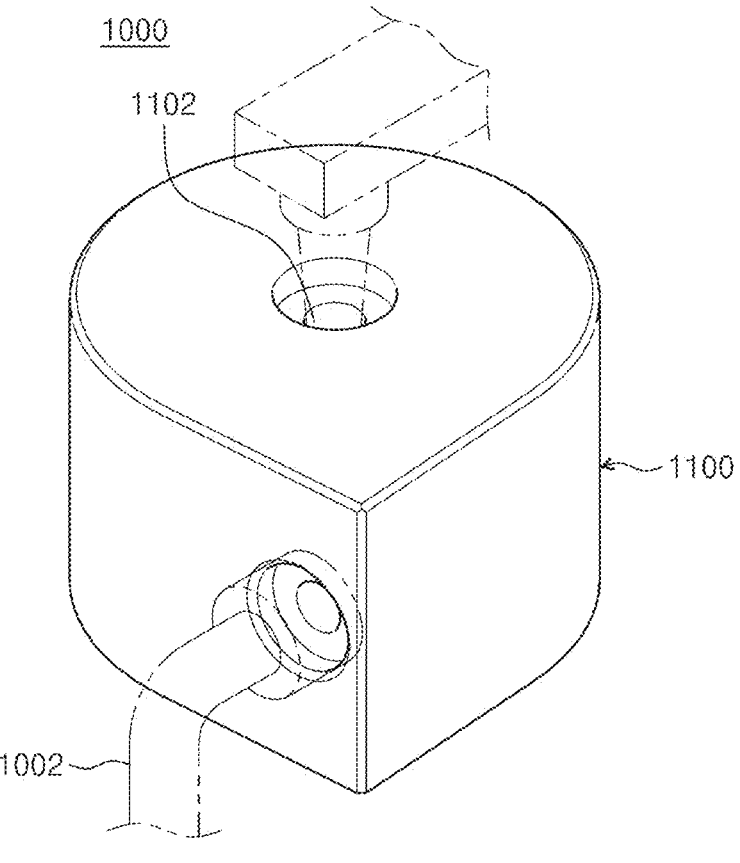
FIG. 8 is a perspective view schematically illustrating one embodiment of a home pot.
Figure 9:
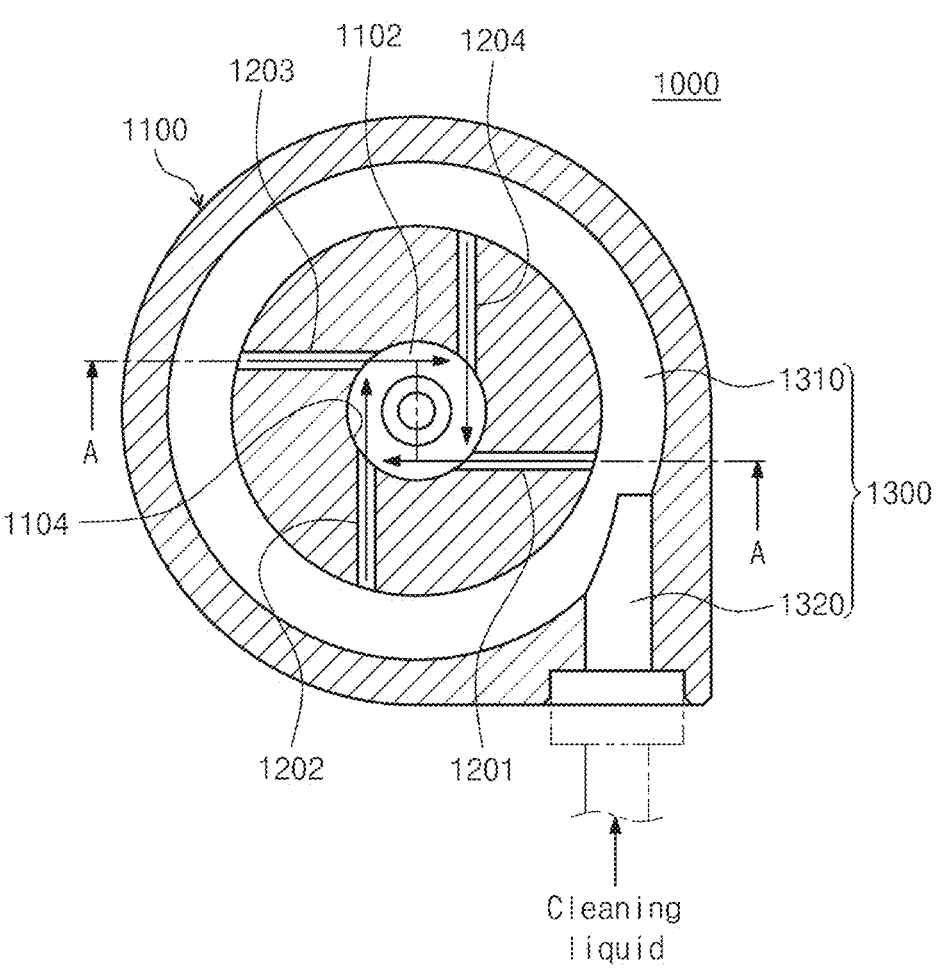
FIG. 9 is a plan cross-sectional view of the home pot illustrated in FIG. 8.
Figure 10:
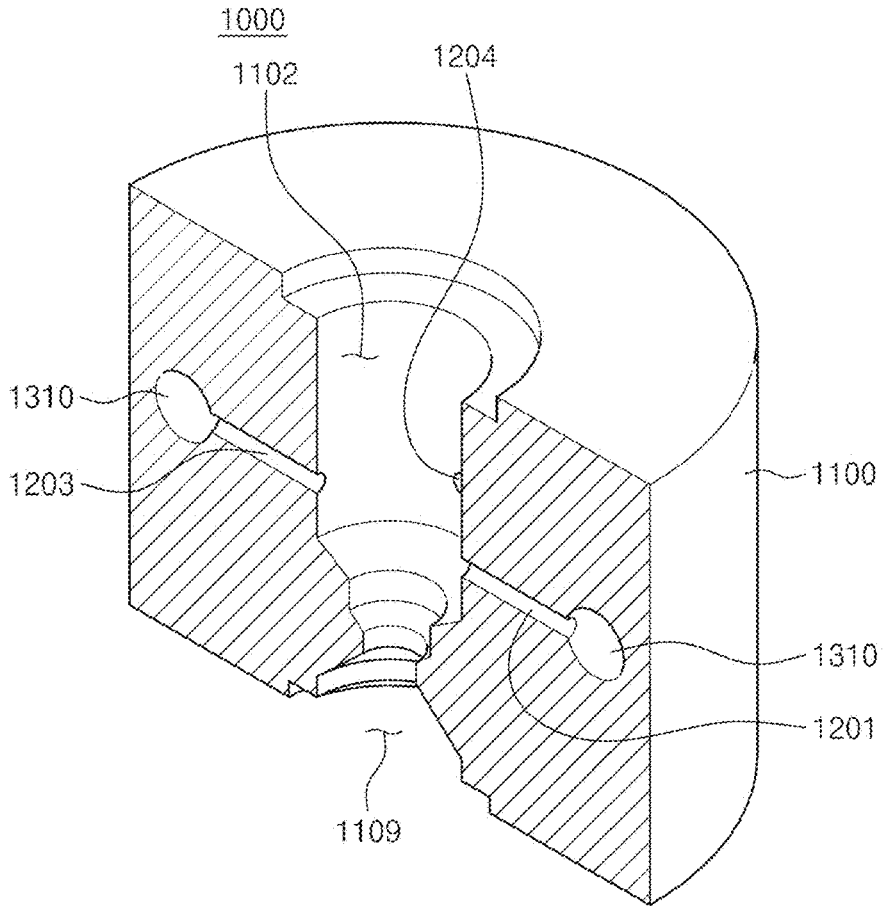
FIG. 10 is a cross-sectional perspective view of the home pot illustrated in FIG. 8.
Figure 11:
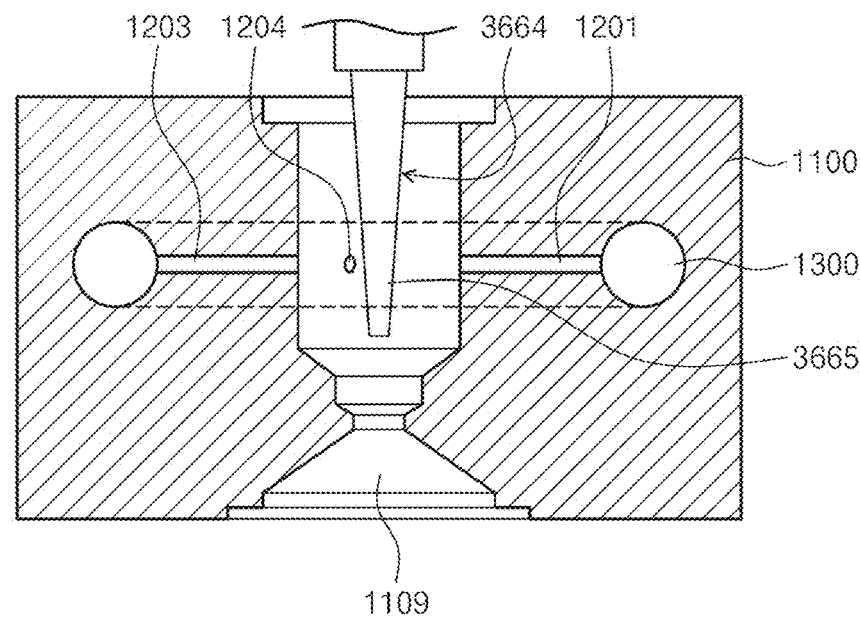
FIG. 11 is a cross-sectional view of the home pot illustrated in FIG. 8.

FIG. 8 is a perspective view schematically illustrating one embodiment of the home pot, FIG. 9 is a plan cross-sectional view of the home pot illustrated in FIG. 8, FIG. 10 is a cross-sectional perspective view of the home pot illustrated in FIG. 8, and FIG. 11 is a cross-sectional view of the home pot illustrated in FIG. 8.

Referring to FIGS. 8 to 11, the home pot 1000 may include a housing 110 and a cleaning liquid supply 1300.

The housing 1100 provides a cylindrical accommodation space 1102 of which an upper part is opened and in which a nozzle tip 3665 of a treating nozzle can be accommodated. The housing 1100 is provided with an outlet 1109 through which a cleaning liquid is discharged under the accommodation space 1102. In the housing 1100, n injection flow paths 1200 are formed on a sidewall 1104 in contact with the accommodation space 1102. Here, n may be an integer of 3 or greater.

The n injection flow paths 1200 may be connected to a main flow path 1310 and may be inclined with respect to the center of the accommodation space 1102 such that a high-speed swirling flow is generated in the accommodation space. In one embodiment of the present invention, the housing 1100 may include first to fourth injection flow paths 1201 to 1204 provided at intervals of 90 degrees. The n injection flow paths 1200 may be provided horizontally. Accordingly, the cleaning liquid injected through the n injection flow paths 1200 may form a relatively horizontal stream line in the accommodation space.

A first injection flow path 1201 is disposed adjacent to the inlet 1320, and the first injection flow path 1201 is provided to inject the cleaning liquid toward an outlet of a second injection flow path 1202, the second injection flow path 1202 is provided to inject the cleaning liquid toward an outlet of a third injection flow path 1203, the third injection flow path 1203 is provided to inject the cleaning liquid toward an outlet of a fourth injection flow path 1204, and the fourth injection flow path 1204 is provided to inject the cleaning liquid toward an outlet of the first injection flow path 1201.

Meanwhile, although not illustrated, the accommodation space may be provided with a stream-lined groove for guiding the cleaning liquid injected from the injection flow path in a swirling direction to the inner wall.

As another example, the n injection flow paths 1200 may be inclined downwardly. In this case, the cleaning liquid injected through the n injection flow paths 1200 may provide a swirling flow inclined downwardly in the circumferential direction in the accommodation space.

Figure 12:
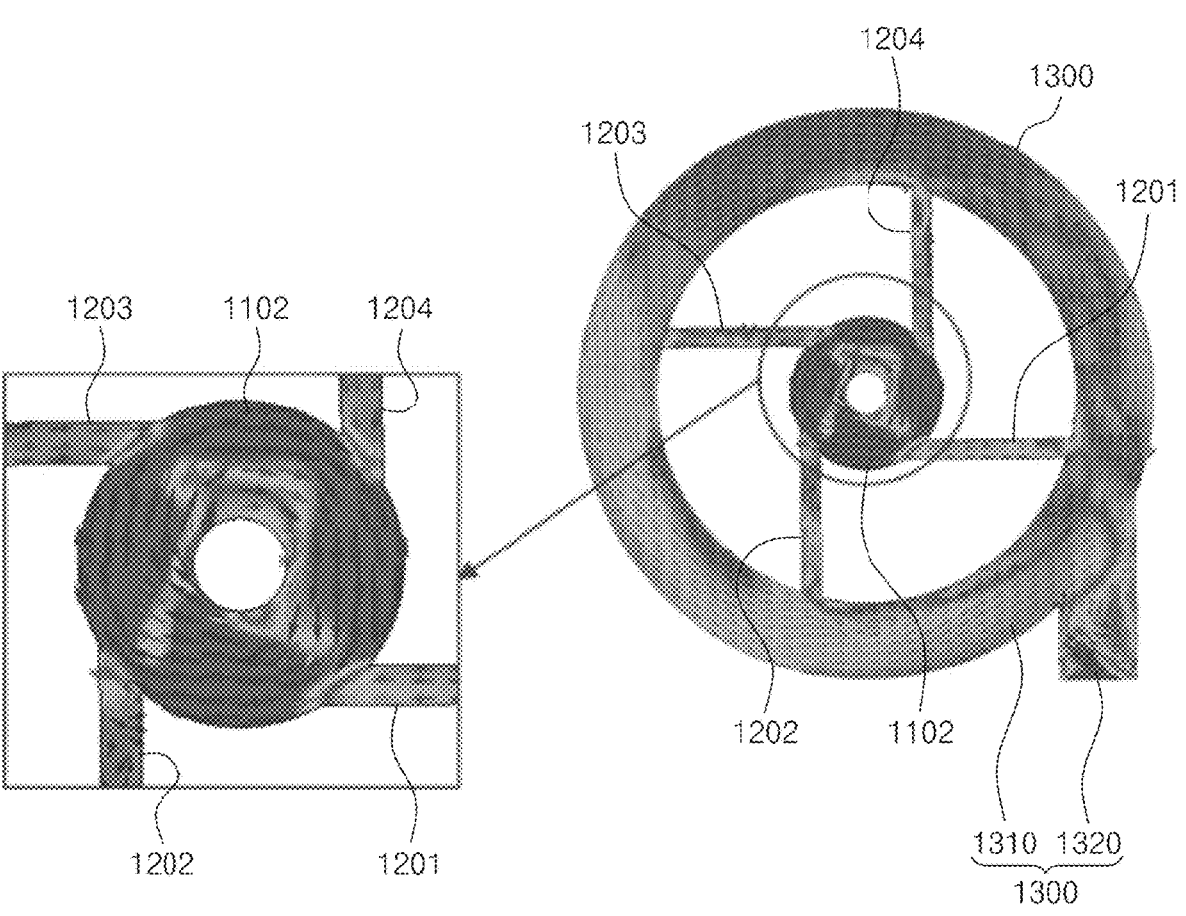
FIG. 12 is a view illustrating a cleaning liquid simulation in the home pot.

FIG. 12 is a view illustrating a cleaning liquid simulation in the home pot.

Referring to FIGS. 9 and 12, the flow of the cleaning liquid in the home pot 1000 having the above-described configuration is as follows.

A flow rate of the cleaning liquid discharged from the first injection flow path 1201 may decrease as the distance from a discharge point increases. However, a cleaning liquid discharged from the first injection flow path 12010 merges with a cleaning liquid discharged from the second injection flow path 1202 to generate a cross-flow, thereby accelerating the flow rate of the cleaning liquid again. In addition, this cleaning liquid collides sequentially with a cleaning liquid discharged from the third injection flow path 1203 and a cleaning liquid discharged from the fourth injection flow path 1204, which can provide a swirling flow at almost the same speed in all directions.

Figure 14A:
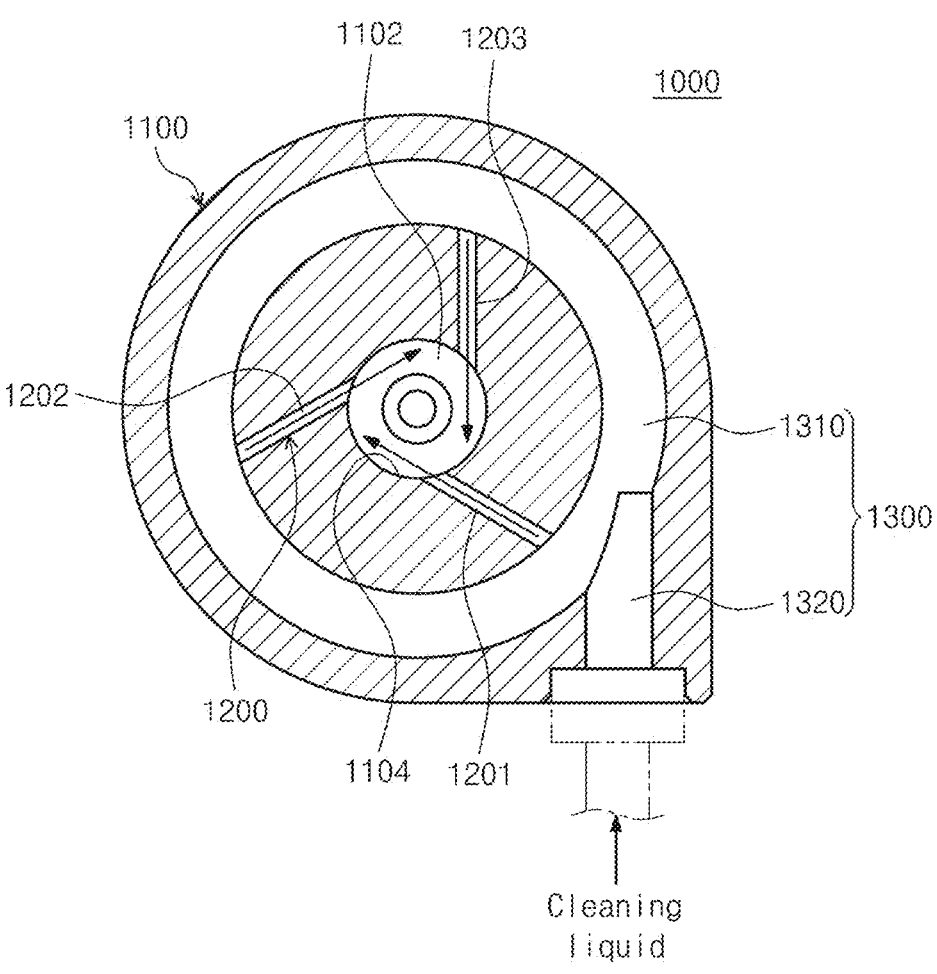
FIG. 14A is a view illustrating a modified example of the home pot having three injection flow paths at intervals of 120 degrees.
Figure 14B:
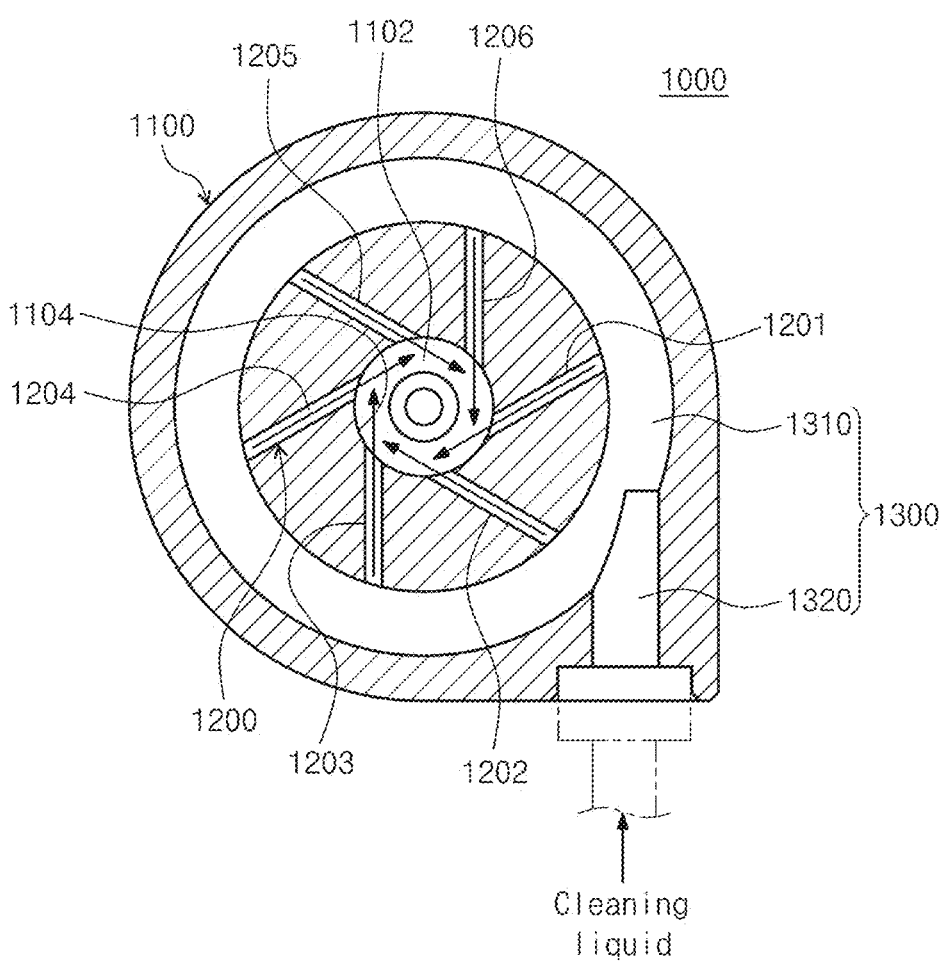
FIG. 14B is a view illustrating a modified example of the home pot having six injection flow paths at intervals of 60 degrees.

In one embodiment of the present invention, the number of injection flow paths 1200 is not limited thereto. As illustrated in FIGS. 14a and 14b, according to another deformed example, three injection flow paths 1200 may be provided at intervals of 120 degrees, or six injection flow paths 1200 may be provided at intervals of 60 degrees.

The cleaning liquid supply portion 1300 supplies the cleaning liquid to the n injection flow paths 1200. The cleaning liquid supply portion 1300 may include the main flow path 1310 and the inlet 1320. The main flow path 1310 may be provided in a ring shape outside the accommodation space 1102. The inlet 1320 may be formed in a tangential direction with respect to an inner wall of the main flow path 91310 such that the cleaning liquid flows into the main flow path 1310.

As described above, the cleaning liquid supply portion may smoothly supply the cleaning liquid to the n injection flow paths 1200. That is, the cleaning liquid supply portion may have a simpler structure than the arrangement in which supply lines are connected to each of the n injection flow paths 1200 and may also supply the cleaning liquid more smoothly. Furthermore, since the cleaning liquid swirls from the main flow path and flows into the n injection flow paths 1200, the effect of increasing the flow rate of the cleaning liquid supplied to the accommodation space can be expected.

Figure 13:
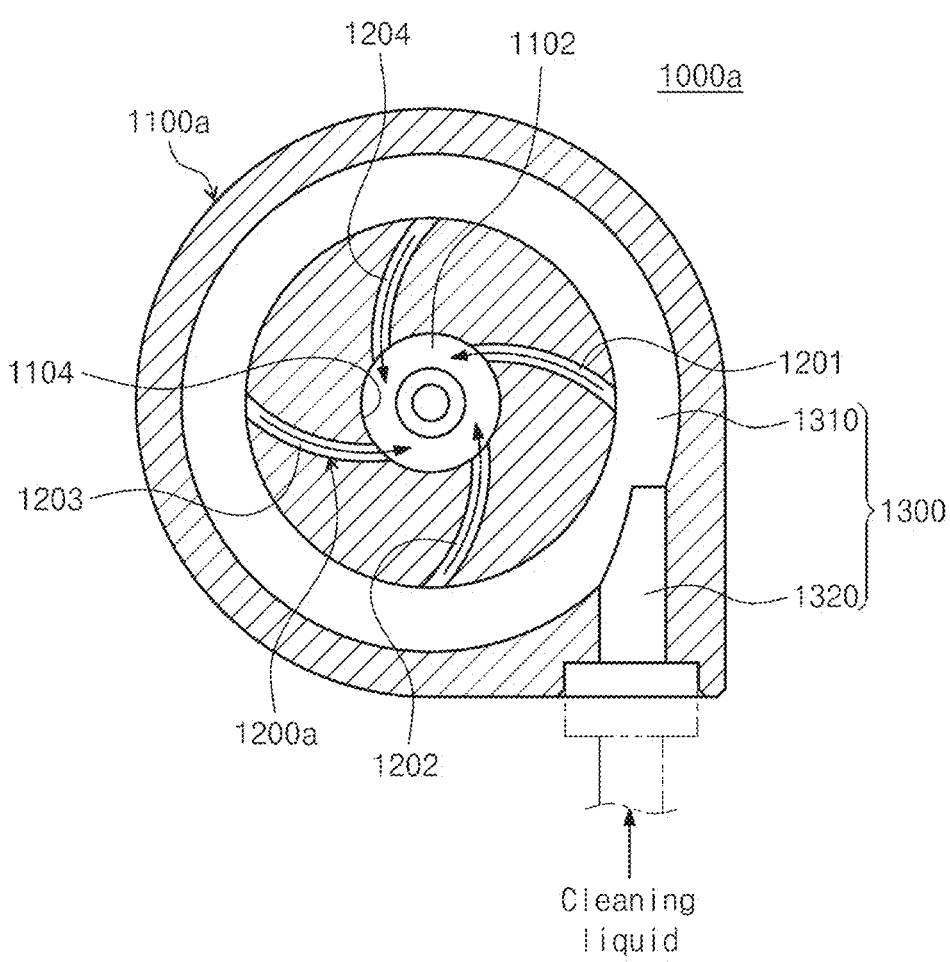
FIG. 13 is a view illustrating a modified example of the home pot.

FIG. 13 is a view illustrating a modified example of the home pot.

As illustrated in FIG. 13, a home pot 1000a includes a housing 1100a and a cleaning liquid supply portion 1300a, and since they are provided in a structure and function substantially similar to the structure and the function in which the housing 1100 and the cleaning liquid supply portion 1300 illustrated in FIG. 9 are provided, detailed descriptions will be omitted In this modified example, n injection flow paths 1200a are provided curvedly. The n injection flow paths 1200a are formed to be curved along a cleaning liquid swirling direction in the main flow path 1310a. Accordingly, the cleaning liquid may smoothly flow from the main flow path 1310a to the n injection flow paths 1200a.

Figure 15:
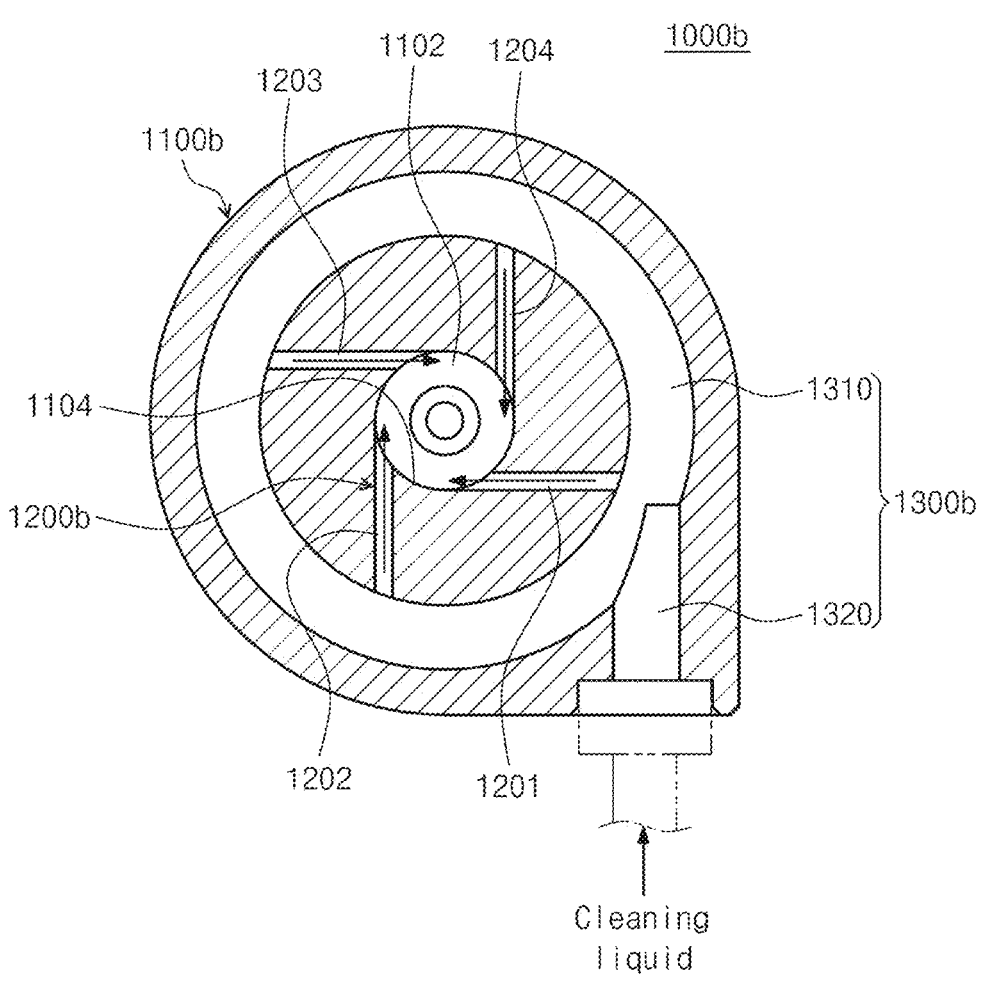
FIG. 15 is a view illustrating a modified example of an injection flow path in the home pot.

FIG. 15 is a view illustrating a modified example of an injection flow path in the home pot.

As illustrated in FIG. 15, a home pot 1000b includes a housing 1100b and a cleaning liquid supply portion 1300b, and since they are provided in a structure and function substantially similar to the structure and the function in which the housing 1100 and the cleaning liquid supply portion 1300 illustrated in FIG. 9 are provided, modified examples will be described based on differences from the present embodiment.

In this modified example, n injection flow paths 1200b are formed in a tangential direction with respect to the inner wall of the accommodation space 1102.

Figure 16:
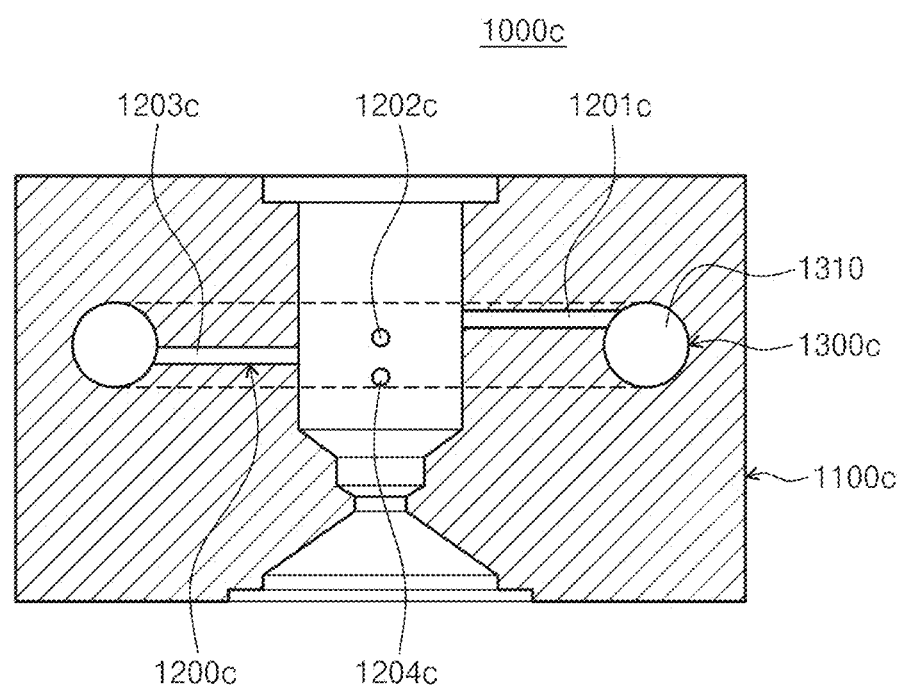
FIG. 16 is a view illustrating a modified example of the injection flow path in the home pot.
Figure 17:
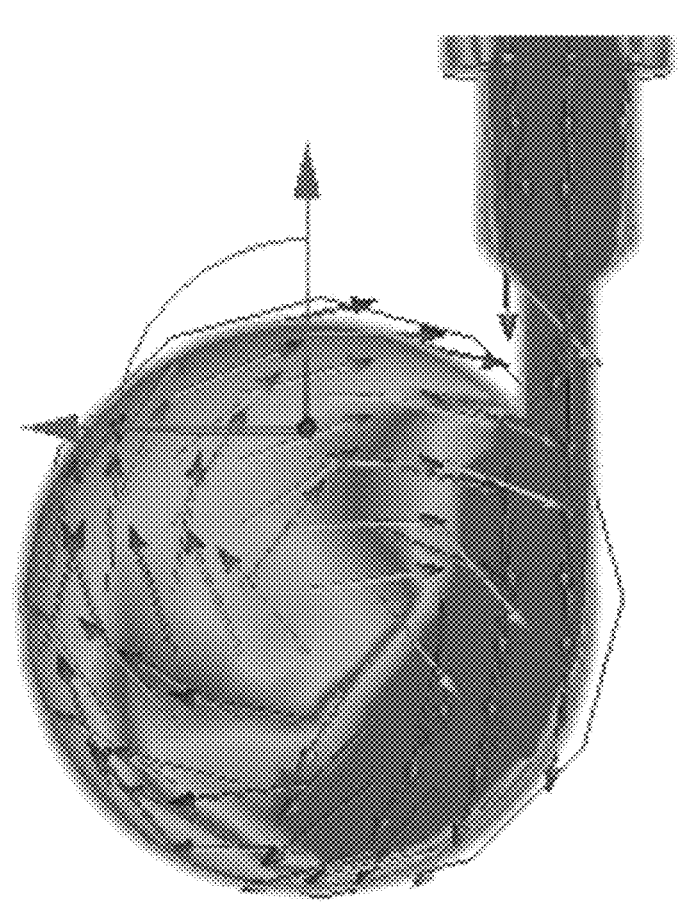
FIG. 17 is a diagram illustrating a cleaning liquid simulation of a conventional swirling flow way.

FIG. 16 is a view illustrating a modified example of the injection flow path in the home pot.

As illustrated in FIG. 16, a home pot 1000c includes a housing 1100c and a cleaning liquid supply portion 1300c, and since they are provided in a structure and function substantially similar to the structure and the function in which the housing 1100 and the cleaning liquid supply portion 1300 illustrated in FIG. 9 are provided, modified examples will be described based on differences from the present embodiment.

In this modified example, n injection flow paths 1200c are provided at different heights. A first injection flow path 1201c closest to the inlet may be disposed highest, and then the height thereof may gradually decrease in the order of a second injection flow path 1202c, a third injection flow path 1203c, and a fourth injection flow path 1204c.

The foregoing detailed description illustrates the present invention. In addition, the above description shows and describes the exemplary embodiments of the present invention, and the present invention may be used in various other combinations, modifications, and environments. That is, changes or modifications are possible within the scope of the concept of the invention disclosed herein, the scope equivalent to the written disclosure, and/or within the scope of skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. In addition, the appended claims should be construed to include other exemplary embodiments as well.

What is claimed is:

1. A home pot comprising:

a housing defining, a cylindrical accommodation space and an opening of the cylindrical accommodation space at an upper part of the cylindrical accommodation space, wherein the housing is configured to accommodate a nozzle tip in the cylindrical accommodation space, and the housing defines n injection flow paths on a sidewall and in contact with the cylindrical accommodation space; and a cleaning liquid supply portion in the sidewall of the housing and configured to supply a cleaning liquid to the n injection flow paths, wherein the n injection flow paths are inclined with respect to a center of the cylindrical accommodation space such that a swirling flow is generated in the cylindrical accommodation space, and wherein the housing defines the cleaning liquid supply portion as including a main flow path in a ring shape and being outside the cylindrical accommodation space, and an inlet configured such that the cleaning liquid flows through the inlet and into the main flow path, the inlet being in a tangential direction with respect to an inner wall of the main flow path, wherein the n injection flow paths are connected to the main flow path.

2. The home pot of claim 1, wherein the n injection flow paths are configured to inject cleaning liquids toward outlets of neighboring injection flow paths.

3. The home pot of claim 1, wherein the n injection flow paths are in a tangential direction with respect to an inner wall of the cylindrical accommodation space.

4. The home pot of claim 1, wherein the n injection flow paths are at a same height.

5. The home pot of claim 1, wherein the n injection flow paths are at different heights.

6. The home pot of claim 1, wherein the n injection flow paths sequentially decrease in height from an injection flow path closest to the inlet in a swirling direction.

7. The home pot of claim 1, wherein the n injection flow paths are defined at equal intervals around the nozzle tip in the cylindrical accommodation space, and are curved in a plan view.

8. The home pot of claim 1, wherein the housing includes an outlet at the center of a lower end of the cylindrical accommodation space.

9. An apparatus for treating a substrate, the apparatus comprising:

a treating unit configured to treat the substrate with liquid;

a home pot outside the treating unit; and a nozzle unit configured to supply a treatment liquid to the substrate in the treating unit and having a nozzle configured to move between a process position to perform a liquid treatment on the substrate in the treating unit and a waiting position to wait in the home pot, wherein the home pot includes, a housing defining, a cylindrical accommodation space and an opening of the cylindrical accommodation space at an upper part of the cylindrical accommodation space, wherein the housing is configured to accommodate a nozzle tip, and the housing further defines n injection flow paths on a sidewall and in contact with the cylindrical accommodation space, wherein n is an integer of 3 or greater; and a cleaning liquid supply portion in the sidewall of the housing and configured to supply a cleaning liquid to the n injection flow paths, wherein the n injection flow paths are inclined with respect to a center of the cylindrical accommodation space such that a swirling flow is generated in the cylindrical accommodation space, and wherein the housing defines the cleaning liquid supply portion as including a main flow path in a ring shape and being outside the cylindrical accommodation space, and an inlet configured such that the cleaning liquid flows through the inlet and into the main flow path, the inlet being in a tangential direction with respect to an inner wall of the main flow path, wherein the n injection flow paths are connected to the main flow path.

10. The apparatus for treating a substrate of claim 9, wherein the n injection flow paths are configured to inject cleaning liquids toward outlets of neighboring injection flow paths.

11. The apparatus of claim 9, wherein the n injection flow paths are in a tangential direction with respect to an inner wall of the cylindrical accommodation space.

12. The apparatus for treating a substrate of claim 9, wherein the n injection flow paths are at a same height.

13. The apparatus of claim 9, wherein the n injection flow paths sequentially decrease in height from an injection flow path closest to the inlet in a swirling direction.

14. The apparatus of claim 9, wherein the n injection flow paths are at equal intervals around the nozzle tip in the cylindrical accommodation space.

15. A home pot comprising:

a housing defining, a cylindrical accommodation space and an opening of the cylindrical accommodation space at an upper part of the cylindrical accommodation space, wherein the housing is configured to accommodate a nozzle tip in the cylindrical accommodation space, and the housing defines n injection flow paths on a sidewall and in contact with the cylindrical accommodation space, wherein n is an integer of 3 or greater; and a cleaning liquid supply portion in the sidewall of the housing and configured to supply a cleaning liquid to the n injection flow paths, wherein the housing defines the cleaning liquid supply portion as including, a main flow path in a ring shape and being outside the cylindrical accommodation space; and an inlet configured such that the cleaning liquid flows through the inlet and into the main flow path, wherein the inlet is in a tangential direction with respect to an inner wall of the main flow path, and wherein the n injection flow paths are connected to the main flow path and are inclined with respect to a center of the cylindrical accommodation space such that a swirling flow is generated in the cylindrical accommodation space.

16. The home pot of claim 15, wherein the n injection flow paths are at intervals of 90 degrees with respect to the cylindrical accommodation space, and a cleaning liquid discharge direction of each of the n injection flow paths faces outlets of neighboring injection flow paths.

* * * * *